US011538762B2

(12) United States Patent
Chun

(10) Patent No.: US 11,538,762 B2
(45) Date of Patent: Dec. 27, 2022

(54) METHODS FOR MAKING DOUBLE-SIDED SEMICONDUCTOR DEVICES AND RELATED DEVICES, ASSEMBLIES, PACKAGES AND SYSTEMS

(71) Applicant: Micron Technology, Inc., Boise, ID (US)

(72) Inventor: Hyunsuk Chun, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/751,676

(22) Filed: Jan. 24, 2020

(65) Prior Publication Data

US 2021/0233851 A1  Jul. 29, 2021

(51) Int. Cl.
*H01L 23/538* (2006.01)
*H01L 21/768* (2006.01)
*H01L 23/00* (2006.01)
*H01L 25/065* (2006.01)

(52) U.S. Cl.
CPC .... *H01L 23/5384* (2013.01); *H01L 21/76831* (2013.01); *H01L 23/5389* (2013.01); *H01L 24/80* (2013.01); *H01L 25/0657* (2013.01)

(58) Field of Classification Search
CPC ... H01L 25/0657; H01L 25/50; H01L 23/481; H01L 23/5384; H01L 21/76898
See application file for complete search history.

(56) References Cited

U.S. PATENT DOCUMENTS 9,023,688 B1  5/2015  Or-Bach et al.
11,133,293 B2*  9/2021  Liu .................. H01L 24/08
2003/0072196 A1  4/2003  Schneider
2004/0221451 A1  11/2004  Chia et al.
2010/0140801 A1  6/2010  Anbai et al.
2012/0187530 A1  7/2012  Zhang et al.
2019/0348389 A1*  11/2019  Pancholi ................. H01L 24/27
2019/0385963 A1  12/2019  Chen et al.
2020/0035560 A1*  1/2020  Block ................. H01L 27/1203

FOREIGN PATENT DOCUMENTS

EP  0238089 A2  9/1987

OTHER PUBLICATIONS

International Search Report for Application No. PCT/US2020/066913, dated May 31, 2021, 8 pages.
Invitation to Pay Additional Fees from International Application No. PCT/US2020/066913, dated Apr. 8, 2021, 15 pages.
Written Opinion of the International Searching Authority for Application No. PCT/US2020/066913, dated May 31, 2021, 14 pages.
Taiwanese First Office Action for Application No. 110100738, dated Jan. 26, 2022, 10 pages.

* cited by examiner

*Primary Examiner* — Jaehwan Oh
*Assistant Examiner* — John M Parker
(74) *Attorney, Agent, or Firm* — TraskBritt

(57) ABSTRACT

Semiconductor devices may include a die including a semiconductor material. The die may include a first active surface including first integrated circuitry on a first side of the die and a second active surface including second integrated circuitry on a second, opposite side of the die. In some embodiments, the die may include two die portions: a first die portion including the first active surface and a second die portion including the second active surface. The first die portion and the second die portion may be joined together with the first active surface facing away from the second active surface.

24 Claims, 12 Drawing Sheets

METHODS FOR MAKING DOUBLE-SIDED SEMICONDUCTOR DEVICES AND RELATED DEVICES, ASSEMBLIES, PACKAGES AND SYSTEMS

FIELD

This disclosure relates generally to methods of making semiconductor devices and resulting semiconductor devices, packages, assemblies and systems. More specifically, disclosed embodiments relate to techniques for making semiconductor devices that may increase circuit density, improve thermal management, reduce height of semiconductor device assemblies and packages including such semiconductor devices, and reduce warpage of substrates of such assemblies and packages.

BACKGROUND

When forming a semiconductor device, conventional techniques known to the inventor may involve forming integrated circuitry on an active surface of a die of the semiconductor device, providing routing pathways for signals through the die utilizing vias, and forming an interconnect on an inactive surface located on a side of the die of the semiconductor device opposite the active surface to connect to the vias. For example, FIG. 9 is a simplified cross-sectional side view of a conventional semiconductor device 900 known to the inventor. The semiconductor device 900 includes a die 902 including and/or formed from a semiconductor material. The die 902 includes an active surface 904 located on one side of the die 902. The active surface 904 includes a front-end-of-line (FEOL) structure 906 for forming and electrically connecting to integrated circuitry supported on, and in contact with, the die 902. A back-end-of-line (BEOL) structure 908 for protecting and electrically connecting to the integrated circuitry supported, and for routing signals across the active surface 904, is located on a side of the FEOL structure 906 opposite the die 902. An interconnect 910 for connecting to the integrated circuitry and optionally for routing signals across the active surface 904, is supported on a side of the BEOL structure 908 opposite the FEOL structure 906. Vias 914 including electrically conductive material extend from one or more portions of the active surface 904, through the semiconductor material of the die 902 to the inactive surface 916. The inactive surface 916 also includes a passivation layer for protecting material of the die 902 and including interconnects 912 electrically connecting to the active circuitry by way of the vias 914, optionally routing signals across the inactive surface 916, and for connecting semiconductor device 900 to another component.

FIG. 10 is a simplified cross-sectional side view of a conventional assembly 1000 of semiconductor devices 900 known to the inventor. FIG. 11 is an enlarged view of a portion of the assembly 1000 of FIG. 10 corresponding to a rectangle-enclosed region 1100 in FIG. 10. With combined reference to FIG. 10 and FIG. 11, the assembly 1000 includes multiple semiconductor devices 900 stacked on top of, and electrically connected to, one another. Each of the semiconductor devices 900 configured as shown in FIG. 9 may have its active surfaces 904 oriented in the same direction, which is upward as shown in FIG. 10 and FIG. 11. The assembly 1000 may include one or more other semiconductor devices 900 lacking the vias 914 and second interconnect 912 on the inactive surface 916, which may be connected to the assembly 1000, such as on top of the stack in a flip-chip orientation as shown in FIG. 10. Adjacent semiconductor devices 900 and/or 1002 may be electrically and mechanically, connected to one another by conductive material 1102 (e.g., solder, copper-to-copper bonding, solderless hybrid bonding) interposed between and bonded to conductive pillars 1104 and conductive pads 1106 of adjacent interconnects 910 and 912.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
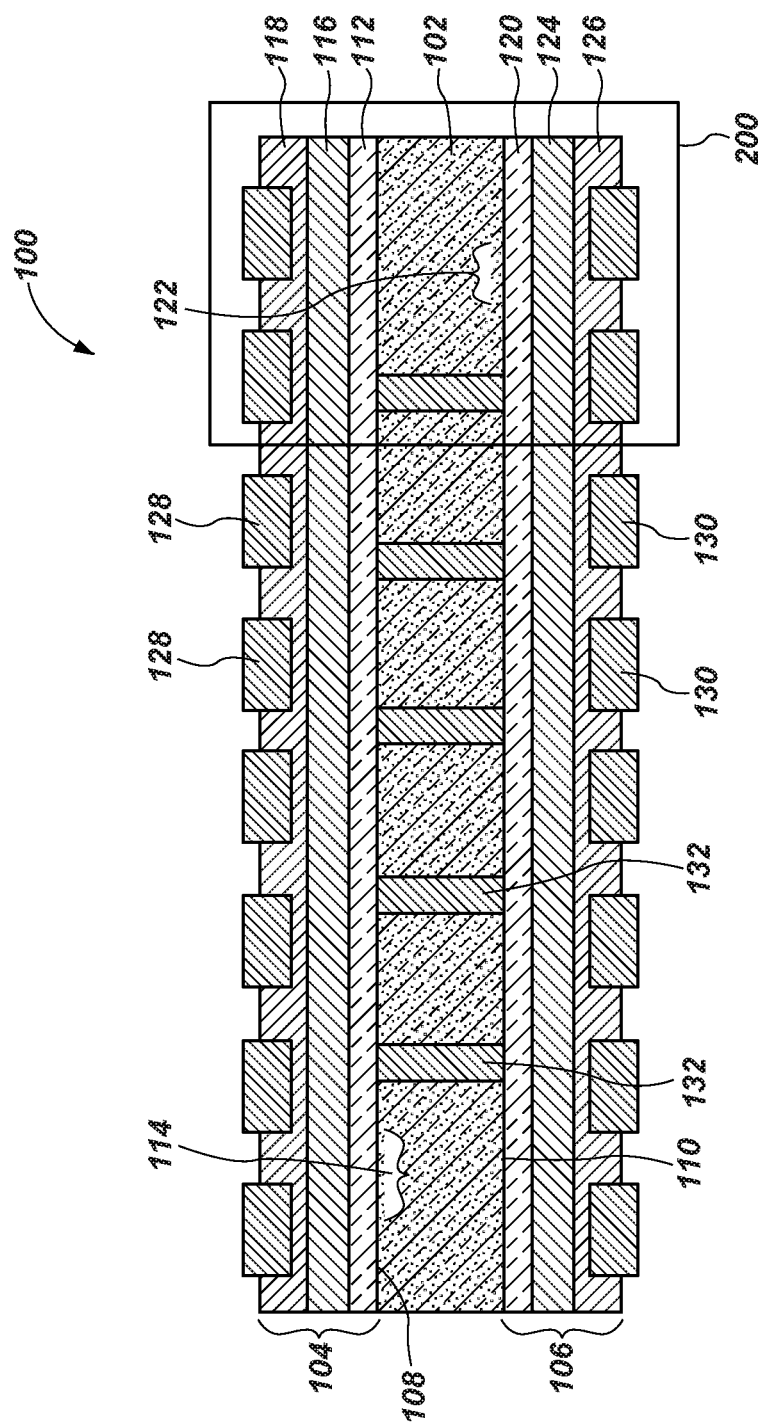
FIG. 1 is a simplified cross-sectional side view of a semiconductor device in accordance with this disclosure.

The illustrations presented in this disclosure are not meant to be actual views of any particular semiconductor device, intermediate component in a process of fabricating a semiconductor device, or component thereof, but are merely idealized representations employed to describe illustrative embodiments. Thus, the drawings are not necessarily to scale.

Disclosed embodiments relate generally to techniques for making semiconductor devices that may increase circuit density, improve thermal management, reduce height of semiconductor device assemblies and packages, and reduce warpage. More specifically, disclosed are embodiments of techniques for making semiconductor devices and related assemblies which may involve forming FEOL and BEOL structures on two active surfaces located on opposite sides of a given semiconductor device. Optionally, two at least substantially identical patterns of integrated circuitry of FEOL structures on opposite sides of the semiconductor device may enable a single semiconductor device to take the place two conventional semiconductor devices in an assembly (e.g., a stack) having at least substantially similar functionality. Having two at least substantially identical patterns of integrated circuitry on the opposite sides of the semiconductor device may also better balance stresses and strains on the substrate (i.e., semiconductor die) of the device, reducing warpage in the semiconductor device. Reducing the number of semiconductor devices in an assembly while providing equivalent functionality, and the quantity of corresponding materials in the form of conductive elements and bond line materials interposed between adjacent semiconductor devices may simultaneously reduce assembly height, improve thermal management, and improve signal speed and quality.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein the terms "layer" and "film" mean and include a level, sheet or coating of material residing on a structure, which level or coating may be continuous or discontinuous between portions of the material, and which may be conformal or non-conformal, unless otherwise indicated.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

FIG. 1 is a simplified cross-sectional side view of a semiconductor device 100 in accordance with this disclosure. The semiconductor device 100 may include, for example, a die 102 (e.g., a chip) including, and principally formed from, a semiconductor material. The semiconductor material of the die 102 may include, for example, silicon, germanium, gallium-Group V material (e.g., GaN), indium-Group V material (e.g., InP). A first active surface 104 may be located on a first side of the die 102, and a second active surface 106 may be located on a second, opposite side of the die 102. For example, the first active surface 104 may be located and supported on a first major surface 108 of the die 102, and the second active surface 106 may located and supported on a second major surface 110 located on an opposite side of the die 102 from the first active surface 104.

In embodiments, semiconductor device 100 comprises a volatile or non-volatile semiconductor memory device. For example, semiconductor device 100 may comprise dynamic random access memory (DRAM), spin torque transfer magnetic random access memory (STT-MRAM), magnetic random access memory (MRAM), static random access memory (SRAM), NAND Flash memory, or another known memory type. Semiconductor device 100, as well as other embodiments, is configured, as will be appreciated from the description which follows and the accompanying drawings, to substantially double memory density per die while maintaining or even reducing form factor per die and reducing form factor in die stacks, increasing signal speed and quality, and facilitating heat transfer in a die stack. The term "semiconductor device" as used herein, is to be interpreted broadly and encompass microelectronic devices which may exhibit functionality other than functionality reliant upon semiconductive materials.

The first active surface 104 may include, for example, a first FEOL structure 112 adjacent to a remainder of the die 102. More specifically, the first FEOL structure 112 may include, for example, doped regions of the semiconductor material of the die 102 and overlying quantities of dielectric and electrically conductive materials selectively positioned to form first integrated (i.e., active) circuitry 114 embedded within and/or supported on the first major surface 108 of the die 102. As a specific, nonlimiting example, the first FEOL structure 112 may include transistors and other electrical components, such as capacitors, resistors, inductors, and/or the like, embedded within and/or supported on the first major surface 108 of the die 102 with protective dielectric material overlying portions of the electrical components and discrete quantities of electrically conductive material in electrical communication with appropriate junctions (e.g., sources, drains) of the respective electrical components. Dielectric materials used for the first FEOL structure 112 may include, for example, oxides, nitrides, and/or glasses (e.g., TEOS, SiO, SiN). Electrically conductive materials used for the first FEOL structure 112 may include, for example, metals (e.g., tungsten, copper), metal alloys, and metal mixtures which may have a low risk of contaminating the semiconductor material of the die 102, which may be put in place by a physical or chemical vapor deposition process (e.g., sputtering).

The first active surface 104 may also include, for example, a first BEOL structure 116 adjacent to the first FEOL structure 112. More specifically, the first BEOL structure 116 may include, for example, quantities of dielectric and electrically conductive materials selectively positioned and configured to form routing elements (e.g., lines, traces, pads, vias) positioned on a side of the first FEOL structure 112 opposite the die 102 (e.g., supported directly on the first FEOL structure 112 with the first FEOL structure 112 interposed between the first BEOL structure 116 and the die 102). As a specific, nonlimiting example, the first BEOL structure 116 may include one or more quantities of protective dielectric material overlying portions of the first FEOL structure 112 and discrete quantities of electrically conductive material in electrical communication with corresponding quantities of electrically conductive material of the first FEOL structure 112, the dielectric material and electrically conductive material cooperatively routing signals, power, or signals and power laterally across the first major surface 108 and/or longitudinally through the first BEOL structure 116 away from the first major surface 108. Dielectric materials used for the first BEOL structure 116 may include, for example, oxides and/or nitrides (e.g., spin-on dielectric material, SiO, SiN). Electrically conductive materials used for the first BEOL structure 116 may include, for example, metals, metal alloys, and metal mixtures, such as tungsten, copper, gold, aluminum, alloys thereof, and/or mixtures thereof, which may be put in place by a plating process (e.g., electroplating, chemical plating), followed by patterning.

In some embodiments, the first active surface 104 may include, for example, a first interconnect 118 adjacent to the first BEOL structure 116. More specifically, the first interconnect 118 may include, for example, quantities of dielectric and electrically conductive materials selectively positioned and configured to form routing and/or connection elements (e.g., lines, traces, pads, bumps, pillars, columns) positioned on a side of the first BEOL structure 116 opposite the first FEOL structure 112 (e.g., supported directly on the first BEOL structure 116 with the first BEOL structure 116 interposed between the first interconnect 118 and the first FEOL structure 112). As a specific, nonlimiting example, the first interconnect 118 may include one or more quantities of protective dielectric material overlying lower portions of the first BEOL structure 116 and discrete quantities of electrically conductive material in electrical communication with corresponding quantities of electrically conductive material of the first BEOL structure 116, the dielectric material and electrically conductive material cooperatively routing signals, power, or signals and power laterally across the first major surface 108 and/or longitudinally through the first interconnect 118 away from the first major surface 108. The first interconnect 118 may include, for example, electrically conductive elements, such as first bond pads 128, bumps, pillars, columns, and the like exposed at an exterior of the first interconnect 118 for connection to other devices and/or structures. Dielectric materials used for the first interconnect 118 may include, for example, polymer materials, oxides, nitrides, and/or glasses (e.g., polyimide, spin-on dielectric material, SiO, SiN). Electrically conductive materials used for the first interconnect 118 may include, for example, metals, metal alloys, and metal mixtures, such as copper, gold, aluminum, tin, lead, solder, alloys thereof, and/or mixtures thereof, which may be put in place by plating and patterning and/or solder positioning and reflow processes.

The second active surface 106 may include, for example, a second FEOL structure 120 adjacent to a remainder of the die 102 on a side of the die 102 opposite the first active surface 104. More specifically, the second FEOL structure 120 may include, for example, doped regions of the semiconductor material of the die 102 and underlying quantities of dielectric and electrically conductive materials selectively positioned and configured to form second integrated circuitry 122 embedded within and/or supported on the second major surface 110 of the die 102. As a specific, nonlimiting example, the second FEOL structure 120 may include transistors and other electrical components, such as capacitors, resistors, inductors, and/or the like, embedded within and/or supported on the second major surface 110 of the die 102 with protective dielectric material underlying portions of the electrical components and discrete quantities of electrically conductive material in electrical communication with appropriate junctions (e.g., sources, drains) of the respective electrical components. Dielectric materials used for the second FEOL structure 120 may include, for example, oxides, nitrides, and/or glasses (e.g., TEOS, SiO, SiN). Electrically conductive materials used for the second FEOL structure 120 may include, for example, metals (e.g., tungsten), metal alloys, and metal mixtures which may have a low risk of contaminating the semiconductor material of the die 102, which may be put in place by a physical or chemical vapor deposition process (e.g., sputtering).

The second active surface 106 may also include, for example, a second BEOL structure 124 adjacent to the second FEOL structure 120. More specifically, the second BEOL structure 124 may include, for example, quantities of dielectric and electrically conductive materials selectively positioned and configured to form routing elements (e.g., lines, traces, pads, vias) positioned on a side of the second FEOL structure 120 opposite the die 102 (e.g., supported directly on the second FEOL structure 120 with the second FEOL structure 120 interposed between the second BEOL structure 124 and the die 102). As a specific, nonlimiting example, the second BEOL structure 124 may include one or more quantities of protective dielectric material underlying portions of the first FEOL structure 112 and discrete quantities of electrically conductive material in electrical communication with corresponding quantities of electrically conductive material of the second FEOL structure 120, the dielectric material and electrically conductive material cooperatively routing signals laterally across the second major surface 110 and/or longitudinally through the second BEOL structure 124 away from the second major surface 110. Dielectric materials used for the second BEOL structure 124 may include, for example, oxides, nitrides, and/or glasses (e.g., spin-on dielectric material, SiO, SiN). Electrically conductive materials used for the second BEOL structure 124 may include, for example, metals, metal alloys, and metal mixtures, such as copper, gold, aluminum, alloys thereof, and/or mixtures thereof, which may be put in place by a plating process (e.g., electroplating, chemical plating), followed by patterning.

In some embodiments, the second active surface 106 may include, for example, a second interconnect 126 adjacent to the first BEOL structure 116. More specifically, the second interconnect 126 may include, for example, quantities of dielectric and electrically conductive materials selectively positioned to form routing and/or connection elements (e.g., lines, traces, pads, bumps, pillars, columns) positioned on a side of the second BEOL structure 124 opposite the second FEOL structure 120 (e.g., supported directly on the remainder of the second BEOL structure 124 with the second BEOL structure 124 interposed between the second interconnect 126 and the second FEOL structure 120). As a specific, nonlimiting example, the second interconnect 126 may include one or more quantities of protective dielectric material underlying portions of the second BEOL structure 124 and discrete quantities of electrically conductive material in electrical communication with corresponding quantities of electrically conductive material of the second BEOL structure 124, the dielectric material and electrically conductive material cooperatively routing signals laterally across the second major surface 110 and/or longitudinally through the second interconnect 126 away from the second major surface 110. The second interconnect 126 may include, for example, electrically conductive elements, such as second bond pads 130, bumps, pillars, columns, and the like exposed at an exterior of the second interconnect 126 for connection to other devices and/or structures. Dielectric materials used for the second interconnect 126 may include, for example, polymer materials, oxides, nitrides, and/or glasses (e.g., spin-on dielectric material, polyimides, SiO, SiN). Electrically conductive materials used for the second interconnect 126 may include, for example, metals, metal alloys, and metal mixtures, such as copper, gold, aluminum, tin, lead, solder, alloys thereof, and/or mixtures thereof, which may be put in place by plating, patterning and solder positioning and reflow processes.

In some embodiments, the first active surface 104 may be at least substantially identical to the second active surface 106. For example, the materials and structures of the first active surface 104, as well as positioning and configuration of same, may be replicated in the second active surface 106 in locations directly across the die 102 from the same materials and structures, such that the semiconductor device 100 may be at least substantially reflectively symmetrical with respect to a plane extending between, and at least substantially parallel to, the first major surface 108 and the second major surface 110. As another example, the same pattern of materials and structures for the first active surface 104 may be replicated in the second active surface 106 in locations laterally offset from the same materials and structures, such that the semiconductor device 100 may be at least substantially rotationally symmetrical with respect to at least one axis located between, and extending at least substantially parallel to, the first major surface 108 and the second major surface 110. Rendering the first active surface 104 at least substantially identical to the second active surface 106 may reduce warpage of the resulting semiconductor device 100 because residual stresses and resulting strains on the die 102 following fabrication may be better balanced on the opposite sides of the die 102.

The semiconductor device 100 may include one or more vias 132 extending between, and interconnecting, the first active surface 104 and the second active surface 106. Additional detail regarding the vias 132 is provided in connection with FIG. 2 and FIG. 3 below.

Figure 2:
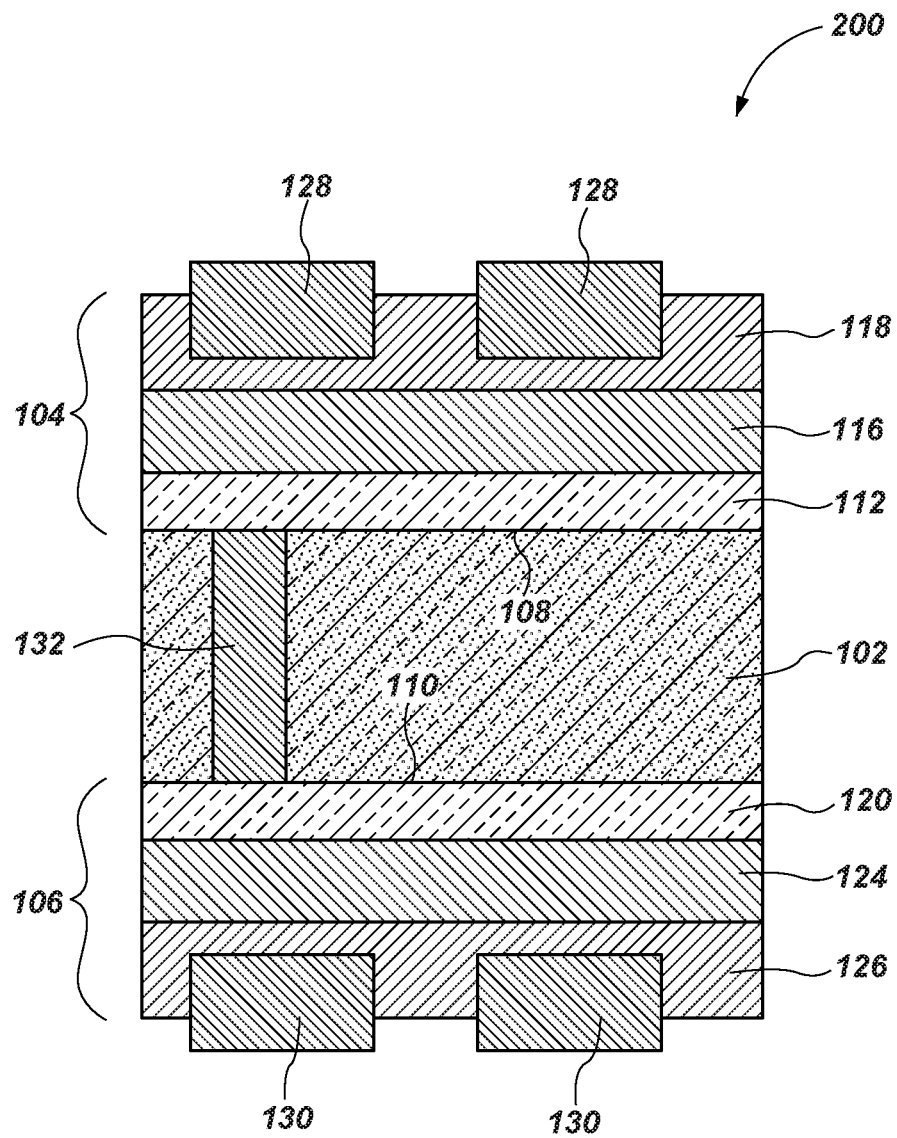
FIG. 2 is an enlarged simplified cross-sectional side view of a highlighted region of FIG. 1.

FIG. 2 is an enlarged simplified cross-sectional side view of a rectangular, framed region 200 of FIG. 1. The vias 132 may extend from a portion of the first active surface 104, through the semiconductor material of the die 102, to a portion of the second active surface 106, and may include an electrically conductive material operatively connecting the first active surface 104 to the second active surface 106. More specifically, each via 132 may include a mass of metal (e.g., copper), metal alloy, or metal mixture material at least laterally surrounded by a dielectric material to reduce the likelihood of contaminating or shorting to the semiconductor material of the die 102 extending from the first major surface 108 of the die 102 or a location within the first active surface 104, longitudinally through the semiconductor material of the die 102, to the second major surface 110 or a location within the second active surface 106.

Figure 3:
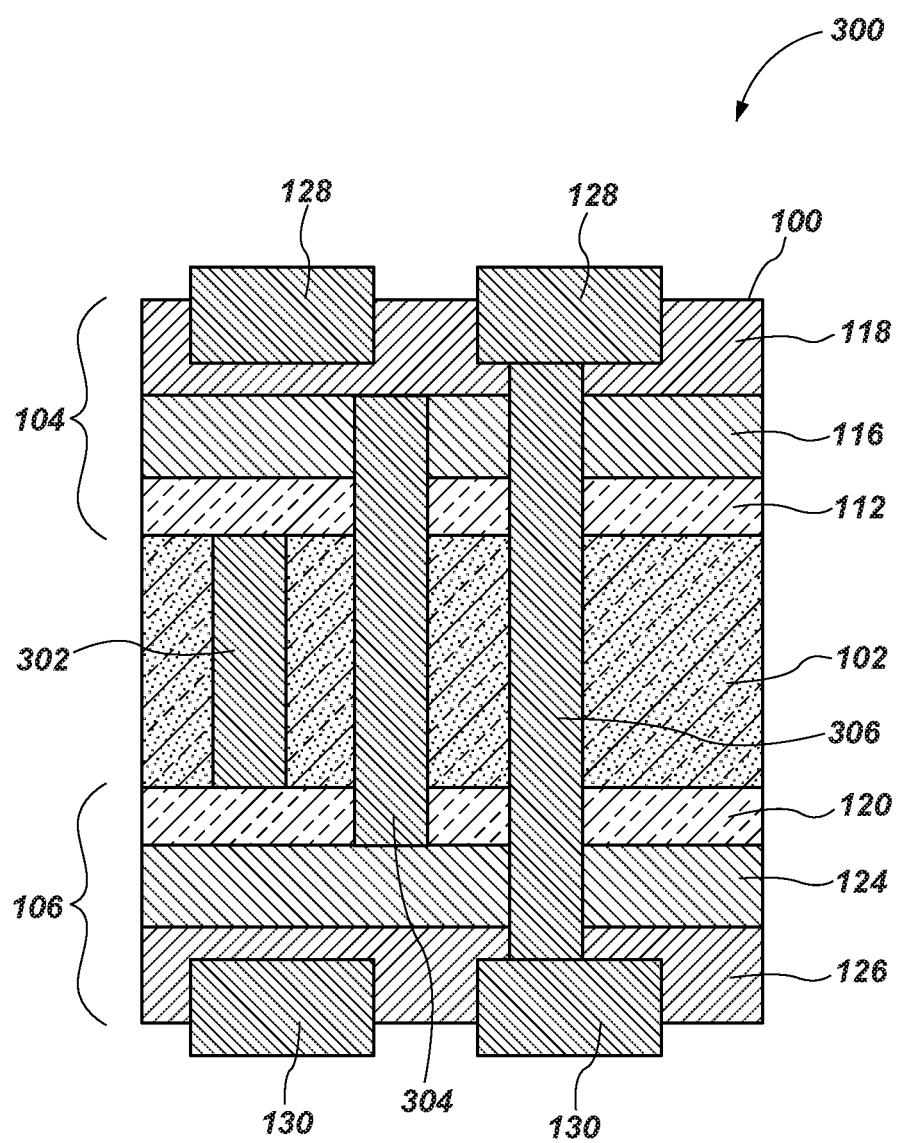
FIG. 3 is another enlarged simplified cross-sectional side view similar to the highlighted region of FIG. 1 depicting approaches to via formation and positioning.

FIG. 3 is another enlarged simplified cross-sectional side view similar to the highlighted region of FIG. 1 depicting approaches to via formation and positioning. In some embodiments, the semiconductor device 100 may include a first via 302, as shown on the left-hand side of FIG. 3, which may result from taking a vias-first approach to via formation. For example, the first via 302 may extend from a location at least substantially between the die 102 and the first FEOL structure 112, through the die 102, to a location at least substantially between the die 102 and the second FEOL structure 120. More specifically, the first via 302 may extend from, for example, the first major surface 108, through the semiconductor material of the die 102, to the second major surface 110. Such a structure may result from forming the first via 302 before forming any portion of the first active surface 104 and before forming any portion of the second active surface 106.

In other embodiments, the semiconductor device 100 may include a second via 304, as shown laterally centrally in FIG. 3, which may result from taking a vias-middle approach to via formation. For example, a second via 304 may extend from a location at least substantially between the first FEOL structure 112 and the first BEOL structure 116 or a location at least substantially between the first BEOL structure 116 and the first interconnect 118, through the die 102, to a location at least substantially between the second FEOL structure 120 and the second BEOL structure 124 or a location at least substantially between the second BEOL structure 124 and the second interconnect 126. More specifically, the second via 304 may extend from, for example, a location at least substantially between the first BEOL structure 116 and the first interconnect 118, through the semiconductor material of the die 102, to a location at least substantially between the second FEOL structure 120 and the second BEOL structure 124. Such a structure may result from forming the second via 304 while forming the first active surface 104 and/or the second active surface 106, such as after forming at least a portion of the first FEOL structure 112 and at least a portion of the second FEOL structure 120, optionally after forming at least a portion of the first BEOL structure 116 and at least a portion of the second BEOL structure 124, and before forming any portion of the first interconnect 118 and any portion of the second interconnect 126.

In other embodiments, the semiconductor device 100 may include a third via 306, as shown on the right-hand side of FIG. 3, which may result from taking a vias-last approach to via formation. For example, a third via 306 may extend from a location at least substantially longitudinally within the first interconnect 118, through the die 102, to a location at least substantially longitudinally within the second interconnect 126. More specifically, the third via 306 may extend from, for example, a location at least substantially between the first BEOL structure 116 and the exterior of the semiconductor device 100 in the first interconnect 118 of the first active surface 104, such as a location underlying and in contact with a first bond pad 128, to a location at least substantially between the second BEOL structure and the exterior of the semiconductor device 100 in the second interconnect 126 of the second active surface 106, such as a location overlying and in contact with a second bond pad 130. Such a structure may result from forming the third via 306 after forming at least a portion of the first interconnect 118 and at least a portion of the second interconnect 126, optionally after forming all of the first active surface 104 and the second active surface 106 other than the first bond pads 128 and the second bond pads 130, or even after completing formation of the first active surface 104 and the second active surface 106.

In other words, semiconductor devices in accordance with this disclosure may include a die including a semiconductor material. The die may include a first active surface including first integrated circuitry on a first side of the die and a second active surface including second integrated circuitry on a second, opposite side of the die.

In some embodiments, semiconductor devices in accordance with this disclosure may include a die including a semiconductor material, the die including two die portions. A first active surface including first active circuitry may be located on a first die portion. A second active surface including second active circuitry may be located on a second die portion. The first die portion and the second die portion may be joined together with the first active surface facing away from the second active surface.

Figure 4:
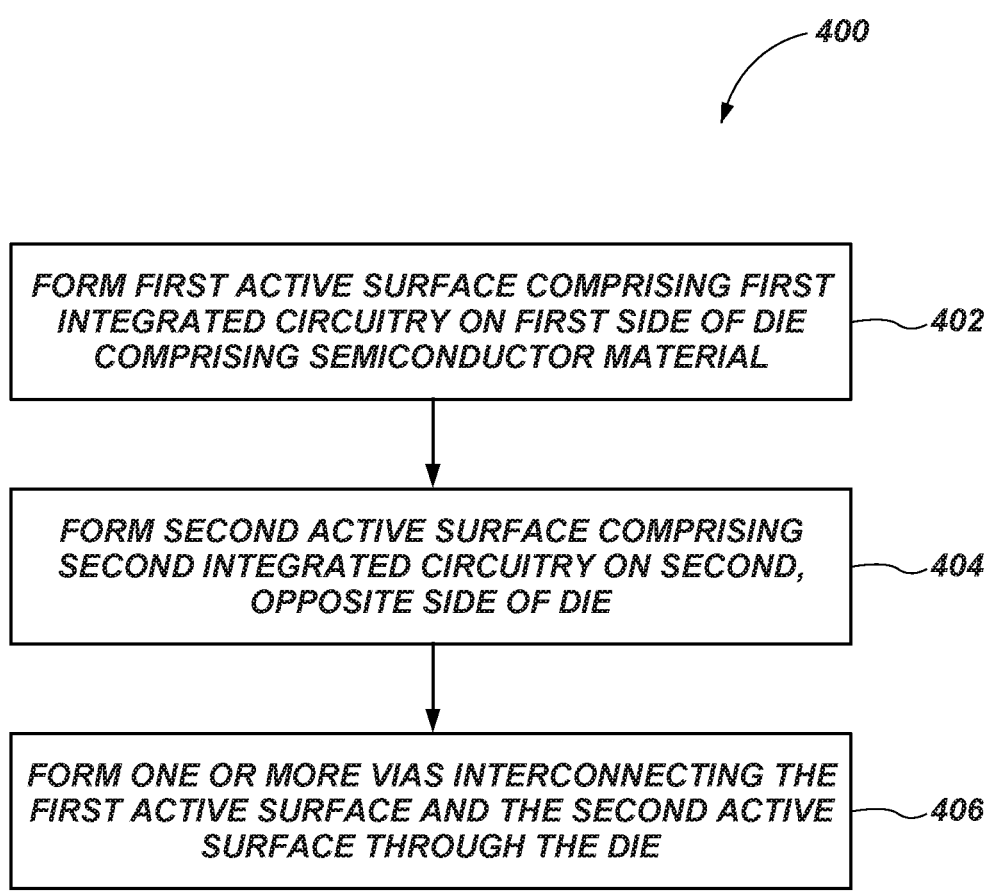
FIG. 4 is a flowchart depicting a method of making semiconductor devices in accordance with this disclosure.

FIG. 4 is a flowchart depicting a method 400 of making semiconductor devices in accordance with this disclosure. With collective reference to FIG. 1 and FIG. 4, the method 400 may involve forming first integrated circuitry 114 on a first active surface 104 on a first side of a die 102 comprising a semiconductor material, as shown at act 402. More specifically, act 404 may involve forming a first FEOL structure 112 on a first major surface 108 of the die 102, subsequently forming a first BEOL structure 116 on a side of the first FEOL structure 112 opposite the die 102, and subsequently forming a first interconnect 118 on a side of the first BEOL structure 116 opposite the first FEOL structure 112. The method 400 may also involve forming second integrated circuitry 122 on a second active surface on a second, opposite side of the die 102, as shown at act 404. More specifically, act 404 may involve forming a second FEOL structure 120 on a second major surface 110 located on a side of the die 102 opposite the first major surface 108, subsequently forming a second BEOL structure 124 on a side of the second FEOL structure 120 opposite the die 102, and subsequently forming a second interconnect 126 on a side of the second BEOL structure 124 opposite the second FEOL structure 120. The method 400 may also involve forming one or more vias 132 electrically interconnecting the first active surface 104 and the second active surface 106 through the semiconductor material of the die 102, as reflected at act 406. Formation of each first via 302 may take place, for example, before forming any portions of the first and second FEOL structures 112 and 120 on the first active surface 104 and the second active surface 106 in accordance with the via-first approach discussed in connection with FIG. 3. As another example, formation of each second via 304 may take place after at least substantially completing formation of the first and second FEOL structures 112 and 120 in accordance with the via-middle approach discussed in connection with FIG. 3. Formation of each third via 306 may take place, for example, after at least substantially completing formation of the first and second BEOL structures 116 and 124 in accordance with the via-last approach discussed in connection with FIG. 3.

In some embodiments, formation of FEOL and BEOL structures of the first active surface 104, second active surface 106, and vias 132 may take place at the wafer level. For example, while structures on the first active surface 104, second active surface 106, and vias 132 of a die 102 are processed, the die 102 may be an unsingulated region of a wafer of the semiconductor material, the wafer including multiple regions that, when singulated, may form discrete semiconductor devices each including their own discrete die 102 (e.g., chip). More specifically, act 402 of the method 400 may involve forming a respective first integrated circuitry 114 on a respective first active surface 104 on a first side of each respective die 102 comprising a respective region of the wafer. Act 404 of the method 400 may involve forming a respective second integrated circuitry 122 on a respective second active surface 106, on an opposite side of each respective die 102 of the wafer. Act 406 of the method 400 may involve forming at least one respective via 132 electrically interconnecting structures on a given first active surface 104 and a given second active surface 106 through the semiconductor material of each given die 102 until each die 102 of the wafer having a respective first active surface 104 and a respective second active surface 106 includes at least one via 132. Following formation, the die 102 and each other respective die 102 may be singulated from a remainder of the wafer, such as, for example, by dicing the wafer along streets between regions of integrated circuitry corresponding to the die 102 and other respective dice 102 with a dicing saw. In some embodiments, at least completion of the relative positioning of FEOL and BEOL structures on the first active surface 104, second active surface 106, and portions of vias 132 of a die may take place independently and on different wafers at the wafer level (e.g., using a wafer-on-wafer approach). For example, FEOL and BEOL structures may be formed on the first active surface 104 of a first, discrete portion of a die 102, which may originally be part of a wafer. Continuing the example, FEOL and BEOL structures may be formed on the second active surface 106 of a second, discrete portion of the die 102, which may originally be part of another, different wafer. Portions of the vias 132 in mutually aligned patterns may be formed in each of the first, discrete portion and the second, discrete portion pf a die 102. Subsequently, the wafers, including the first, discrete portion and the second, discrete portion may be joined back-to-back by their inactive surfaces to form the die 102. Thereafter, individual semiconductor devices, each including its own respective die 102, may be singulated from one another.

In other embodiments, at least completion of the relative positioning of FEOL and BEOL structures on the first active surface 104, second active surface 106, and portions of vias 132 may take place at the chip level (e.g., using a chip-on-chip approach). For example, FEOL and BEOL structures may be formed on the first active surface 104 of a first, discrete portion of a die 102, which may originally be part of a wafer that may be singulated to form the first, discrete portion. Continuing the example, FEOL and BEOL structures may be formed on the second active surface 106 of a second, discrete portion of the die 102, which may originally be part of the same or another wafer that may be singulated to form the second, discrete portion. Portions of the vias 132 may be formed in each of the first, discrete portion and the second, discrete portion. Subsequently the first, discrete portion and the second, discrete portion may be joined back-to-back by their inactive surfaces to form the die 102.

In still other embodiments, at least completion of the relative positioning of FEOL and BEOL structures on the first active surface 104, second active surface 106, and portions of vias 132 may take place at both the chip and the wafer levels (e.g., using a chip-on-wafer approach, using a wafer-on-wafer approach). For example, the FEOL and BEOL structures on the first active surface 104 may be formed on a first, discrete portion of a die 102, which may originally be part of a wafer that has been singulated to form the first, discrete portion. Continuing the example, the FEOL and BEOL structures on the second active surface 106 may be formed on a second, discrete portion of the die 102, which may originally be an unsingulated part of another wafer. Portions of the vias 132 may be formed in each of the first, discrete portion and the second, discrete portion. Subsequently the first, discrete portion and the second, discrete portion may be joined to form the die 102 while the second, discrete portion remains part of the other wafer. Thereafter, individual semiconductor devices 100, each including its own respective die 102, may be singulated from one another, completing formation and relative positioning of the FEOL and BEOL structures on the first active surface 104, the second active surface 106, and vias 132.

Figure 5:
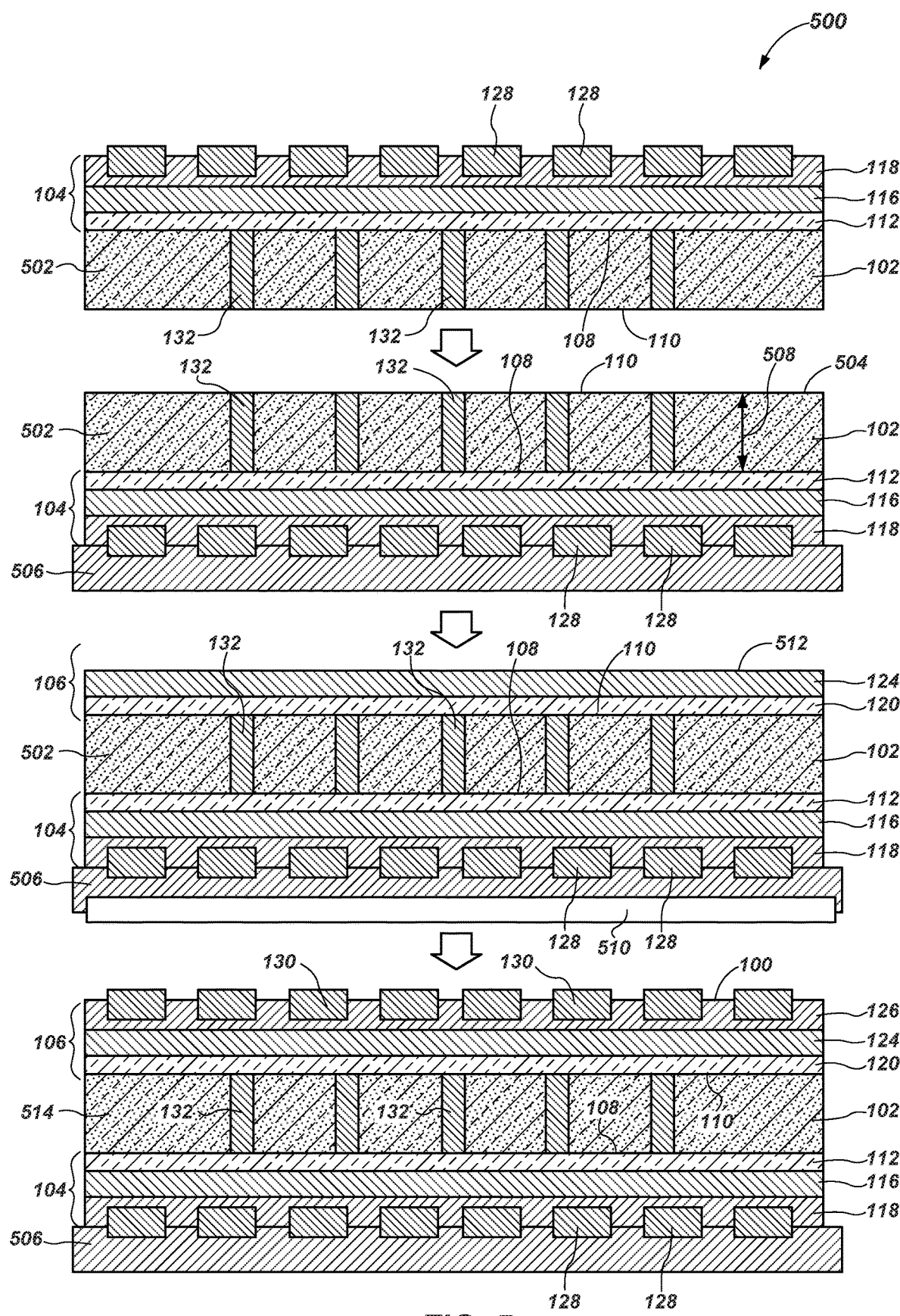
FIG. 5 depicts simplified cross-sectional side views of intermediate products formed in accordance with certain methods of making semiconductor devices in accordance with this disclosure.

FIG. 5 depicts simplified cross-sectional side views of intermediate products formed in accordance with certain methods of making semiconductor devices. For example, a first intermediate product 500 depicted in an uppermost position in FIG. 5 may correspond to a first phase in a method of making one or more semiconductor devices. The first intermediate product 500 may include, for example, a wafer 502. More specifically, the first intermediate product 500 may include a wafer 502 of semiconductor material having multiple regions on which may be formed FEOL and BEOL structures, and via portions, of respective dice 102 for corresponding semiconductor devices. The regions may be positioned in a pattern across the wafer 502, such as, for example, by being arrayed in a grid. When taking a vias-first approach, vias 132 extending longitudinally through the wafer 502 from the first major surface 108 to the second major surface 110 may be formed before formation of any portion of FEOL and BEOL structures on the first active surface 104 and any portion of FEOL and BEOL structures on the second active surface 106.

The first active surface 104 is configured on and partially within the first major surface 108 of the wafer 502. For example, respective areas of the first active surface 104 comprising die locations may be used to form respective areas of FEOL structures 112 comprising first integrated circuitry and associated structures, first BEOL structures 116 and first interconnects 118 for at least some, and up to all, of the regions to be singulated into individual dice 102 for semiconductor devices.

A second intermediate product 504, as depicted in an upper middle position below the first intermediate product 500 in FIG. 5, may be produced by supporting the wafer 502 in an inverted position on a carrier. For example, the first active surface 104 may be positioned proximate to the carrier 506, such that the first active surface 104 may be interposed between the carrier 506 and the semiconductor material of the die 102. The carrier 506 may include, for example, another wafer 502 of semiconductor material, a wafer of a glass material, a ceramic material, or any other suitable carrier known in the art.

While the wafer 502 is supported on the carrier 506, and before forming FEOL and BEOL structures on the second active surface 106, the second major surface 110 may be planarized. A third intermediate product 512 depicting the wafer 502 and carrier 506 during the process of forming the FEOL and BEOL structures on the second active surface 106 is shown in the lower middle of FIG. 5. For example, semiconductor material of the wafer 502, and material of the vias 132 in embodiments where the vias 132 have already been formed as blind vias, may be removed from the second major surface 110 to substantially thin the wafer 502 and expose the vias 132 by a grinding and/or polishing process. Planarizing may also thin the wafer 502, as measured in a direction perpendicular to the second major surface 110. A remaining thickness 508 of the wafer 502, as measured from the first major surface 108 to the second major surface 110 following planarization may be, for example, about 500 µm or less. More specifically, the final thickness 508 of the wafer 502 may be between about 20 micrometers and about 50 micrometers. As a specific, nonlimiting example, the final thickness 508 of the wafer 502 may be between about 20 µm and about 40 µm (e.g., about 30 micrometers).

While the wafer 502 remains supported on the carrier 506, the second FEOL and BEOL structures may be formed on the second active surface 106 on and optionally partially within the second major surface 110 of the wafer 502. For example, respective areas of the second active surface 106 corresponding to semiconductor die locations (as a result of inverting the wafer 502 when transitioning from the first intermediate product 500 to the second intermediate product 504) may be used to form respective areas of second FEOL structures 120 comprising second integrated circuitry and associated structures, second BEOL structures 124, and second interconnects 126 for at least some, and up to all, of the regions to be singulated into individual dice 102 for semiconductor devices.

While forming FEOL and BEOL structures on the second active surface 106, portions of the wafer 502 and/or portions of the environment to which the wafer 502 is exposed may be actively cooled. For example, at least the first FEOL and BEOL structures on the first active surface 104 and/or the portions of the environment proximate to the first active surface 104 may be cooled to a reduced temperature (e.g., a temperature below what would otherwise be the temperature of the relevant portions of the wafer 502 and/or the environment absent cooling) to reduce the likelihood that elevated temperature processing conditions associated with formation of second FEOL and BEOL structures on the second active surface 106 may affect (e.g., damage) the first FEOL and BEOL structures. More specifically, the wafer 502 and carrier 506 may be mounted on a cooling chuck 510 during formation of the second FEOL and BEOL structures on the second active surface 106. The cooling chuck 510 may be positioned on a side of the carrier 506 opposite the wafer 502 or the cooling chuck may be configured to function as a carrier which, in either instance, may place the cooling chuck 510 proximate to the first active surface 104 to provide cooling thereto and distal from the second active surface 106 to reduce the likelihood of introducing defects in the first FEOL and BEOL structures during formation of the second FEOL and BEOL structures.

Following completion of formation of the second FEOL structures 120, BEOL structures 124 and interconnects 126 on the second active surface 106, the wafer 502 may be singulated into individual semiconductor devices 100. A fourth intermediate product 514 depicting one of the semiconductor devices 100 and carrier 506 following singulation is shown at the bottom of FIG. 5. Singulation may involve dicing the wafer 502 along streets between regions of integrated circuitry corresponding to each respective semiconductor device 100 with a dicing saw.

After completing singulation, each respective semiconductor device 100 and any other semiconductor devices formed using the wafer 502 may be removed from the carrier 506.

Figure 6:
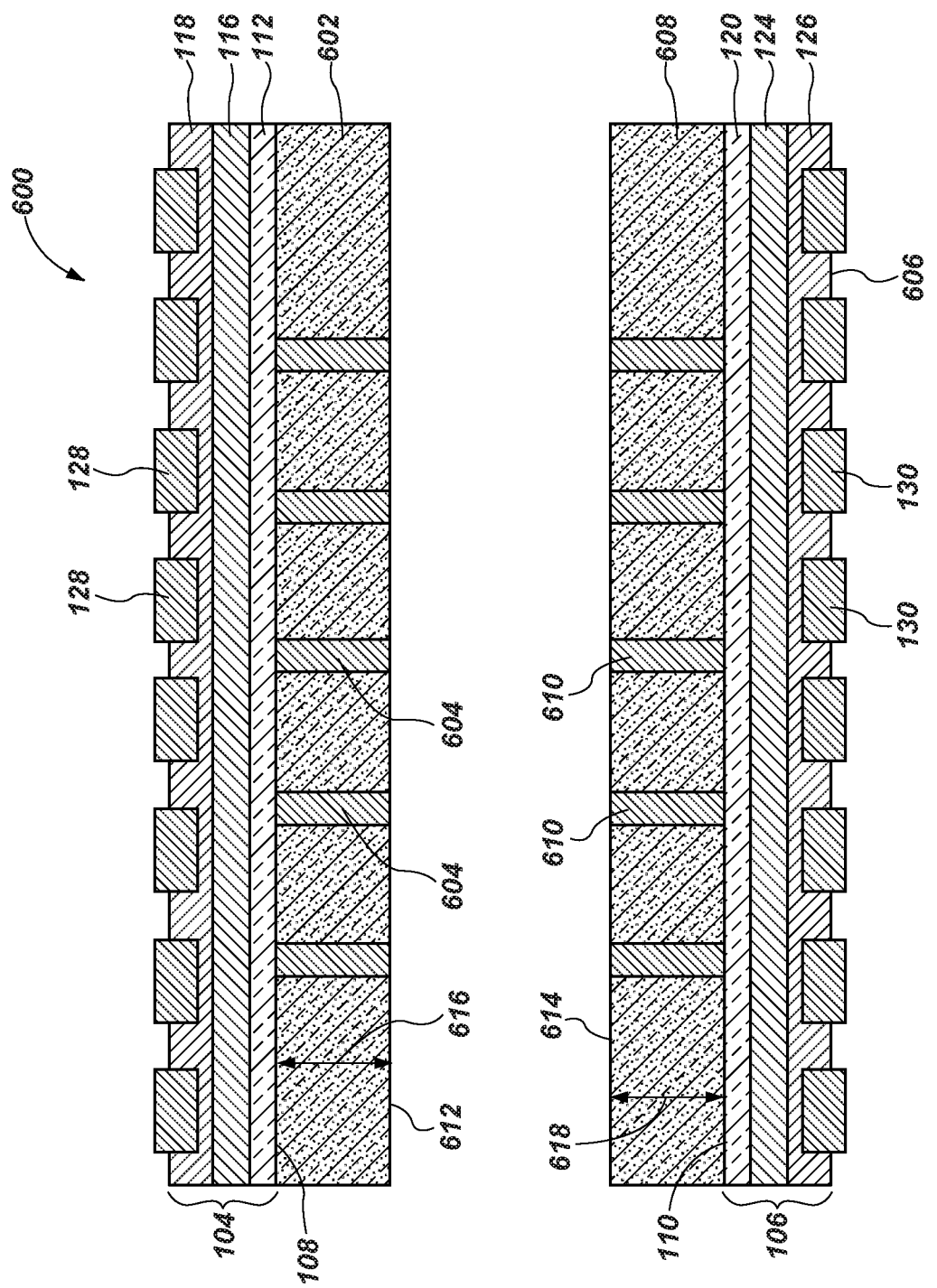
FIG. 6 depicts simplified cross-sectional side views of other intermediate products formed in accordance with other methods of making semiconductor devices in accordance with this disclosure.

FIG. 6 depicts simplified cross-sectional side views of other intermediate products formed in accordance with other methods of making semiconductor devices. In this embodiment, two discrete die portions each having a single active surface with FEOL structure, BEOL structure, interconnect, bond pads, and via portions extending from the active surface to a back side of the respective die portion are joined back-to-back to form die 602 with vias extending between the active surfaces. Stated another way, two semiconductor die are joined back-to-back to form a composite die with vias extending between opposing active surfaces.

For example, a first other intermediate product 600 depicting a first, discrete portion of the die 602 having the first active surface 104 is shown in the upper portion of FIG. 6. More specifically, the first other intermediate product 600 may include a first, discrete portion of the die 602, which may be in the form of a region of a wafer 502 having multiple discrete portions of respective dice arrayed in a grid (e.g., for wafer-on-wafer or chip-on-wafer approaches) or in the form of a singulated portion of a die or chip (e.g., for chip-on-wafer or chip-on-chip approaches). The first, discrete portion of the die 602 may include a first active surface 104, including the first FEOL structure 112, first BEOL structure 116, and first interconnect 118, as well as first bond pads 128 and first, discrete portions of the vias 604 extending longitudinally through the semiconductor material of the first, discrete portion of the die 602.

A second other intermediate product 606 depicting a second, discrete portion of the die 608 having the second active surface 106 is shown in the upper portion of FIG. 6. More specifically, the second other intermediate product 606 may include a second, discrete portion of the die 608, which may be in the form of a region of a wafer 502 (FIG. 5) having multiple discrete portions of respective dice arrayed in a grid (e.g., for wafer-on-wafer or chip-on-wafer approaches) or in the form of a singulated portion of a die or chip (e.g., for chip-on-wafer or chip-on-chip approaches). The second, discrete portion of the die 608 may include a second active surface 106, including the second FEOL structure 120, second BEOL structure 124, and second interconnect 126, as well as second bond pads 130 and second, discrete portions of the vias 610 extending longitudinally through the semiconductor material of the second, discrete portion of the die 608.

After formation of FEOL structures, BEOL structures, interconnects, bond pads and via portions on the discrete die portions 602, 608, each of the first discrete portion of the die 602 and the second, discrete portion of the die 608 may be thinned from the third major surface 612 opposite the first active surface 104 toward the first active surface 104 and from the fourth major surface 614 opposite the second active surface 106 toward the second active surface 106, respectively. Thinning may be accomplished utilizing any of the planarization processes discussed previously herein. A remaining thickness 616 of the first, discrete portion of the die 602, as measured from the first major surface 108 to the third major surface 612, and a remaining thickness 618 of the second, discrete portion of the die 608, as measured from the second major surface 110 to the fourth major surface 614, following planarization may be, for example, about 40 micrometer or less. More specifically, each of the final thickness 616 of the first, discrete portion of the die 602 and the final thickness 618 of the second, discrete portion of the die 608 may be between about 15 micrometers and about 40 micrometers. As a specific, nonlimiting example, the final thickness 616 of the first, discrete portion of the die 602 and the final thickness 618 of the second, discrete portion of the die 608 may be between about 15 micrometers and about 30 micrometers (e.g., about 20 micrometers). Thinning each of the first, discrete portion of the die 602 and the second, discrete portion of the die 608 to a greater degree than the standalone wafer 502 may enable a resulting die of a semiconductor device formed from the first, discrete portion of the die 602 and the second, discrete portion of the die 608 to have a total, combined thickness at least substantially equal to, or not excessively greater than, the thickness 508 of the wafer 502 (see FIG. 5).

After formation and thinning, the first, discrete portion of the die 602 and the second, discrete portion of the die 608 may be bonded to one another to form the die 102 (see FIG. 1) including the first active surface 104 and the second active surface 106. For example, the third major surface 612 of the first, discrete portion of the die 602 may be contacted to the fourth major surface 614 of the second, discrete portion of the die 608, and the first, discrete portion of the die 602 and second, discrete portion of the die 608 may be exposed to an elevated temperature (e.g., a temperature above room temperature) to bond the first, discrete portion of the die 602 to the second, discrete portion of the die 608. Bonding of the semiconductor material of the first, discrete portion of the die 602 to the semiconductor material of the second, discrete portion of the die 608 may be characterized as a surface-activated chemical bond of the semiconductor material of the two discrete portions (i.e., silicon dioxide to silicon dioxide) stimulated by activation of the surfaces to be bonded by exposure to a plasma, and conducted in association with via-to-via diffusion bonding as described below in what may be described as hybrid bonding.

When contacting the third major surface 612 to the fourth major surface 614, the first, discrete portions of the vias 604 may be aligned with, and contacted to, the second, discrete portions of the vias 610. Uniting the first, discrete portions of the vias 604 to the second, discrete portion of the vias 610 may also occur by diffusion bonding the electrically conductive material of each first, discrete portion of the via 604 to the electrically conductive material (e.g., copper) of a corresponding second, discrete portion of the via 610 by application of heat to the assembly.

In other words, methods of making semiconductor devices in accordance with this disclosure may involve forming first integrated circuitry on a first active surface on a first side of a die including a semiconductor material. Second integrated circuitry may be formed on a second active surface on a second, opposite side of the die.

In some embodiments, methods of forming semiconductor devices may involve independently forming an FEOL structure, a BEOL structure, and an interconnect on active surfaces of each of two separate die portions comprising semiconductor material. The two separate die portions may be bonded by back sides thereof opposite the active surfaces.

Methods of forming semiconductor devices in accordance with this disclosure may also involve independently forming an FEOL structure, a BEOL structure, and an interconnect on active surfaces of each of two separate die portions comprising semiconductor material. The two separate die portions may be bonded by back sides thereof opposite the active surfaces.

Figure 7:
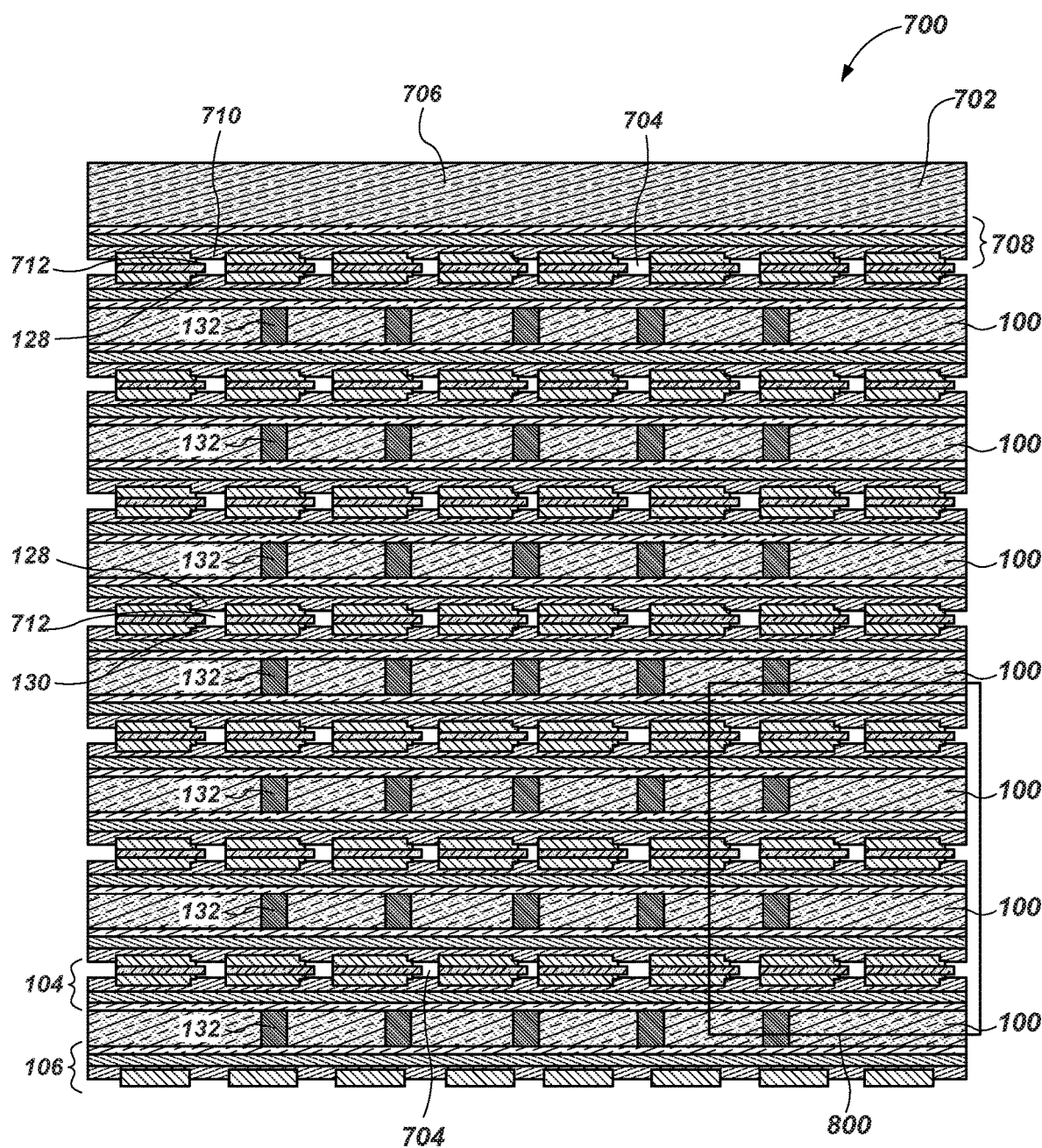
FIG. 7 is a simplified cross-sectional side view of an assembly of semiconductor devices in accordance with this disclosure.
Figure 8:
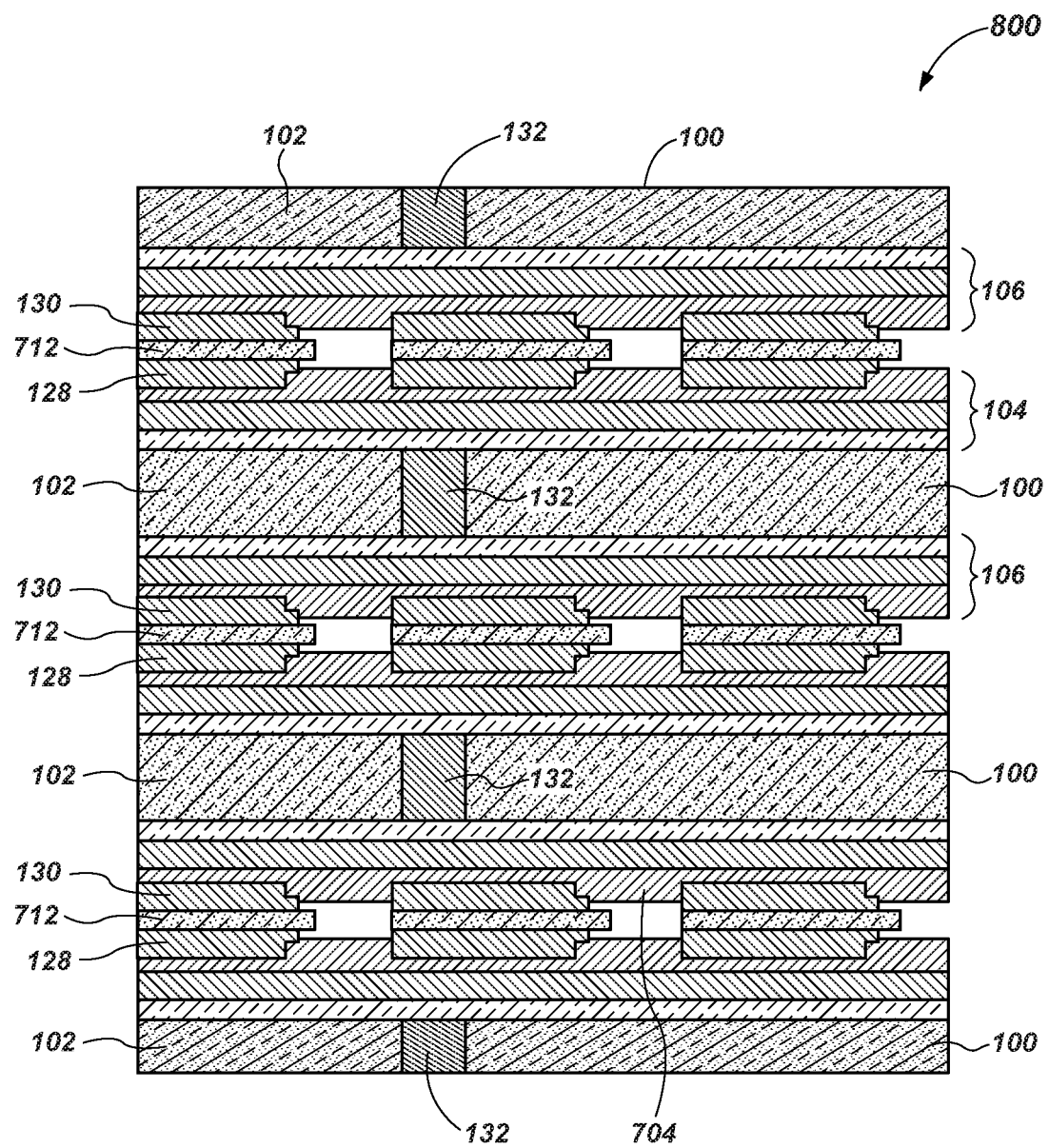
FIG. 8 is a simplified cross-sectional side view of a highlighted region of FIG. 7.
Figure 9:
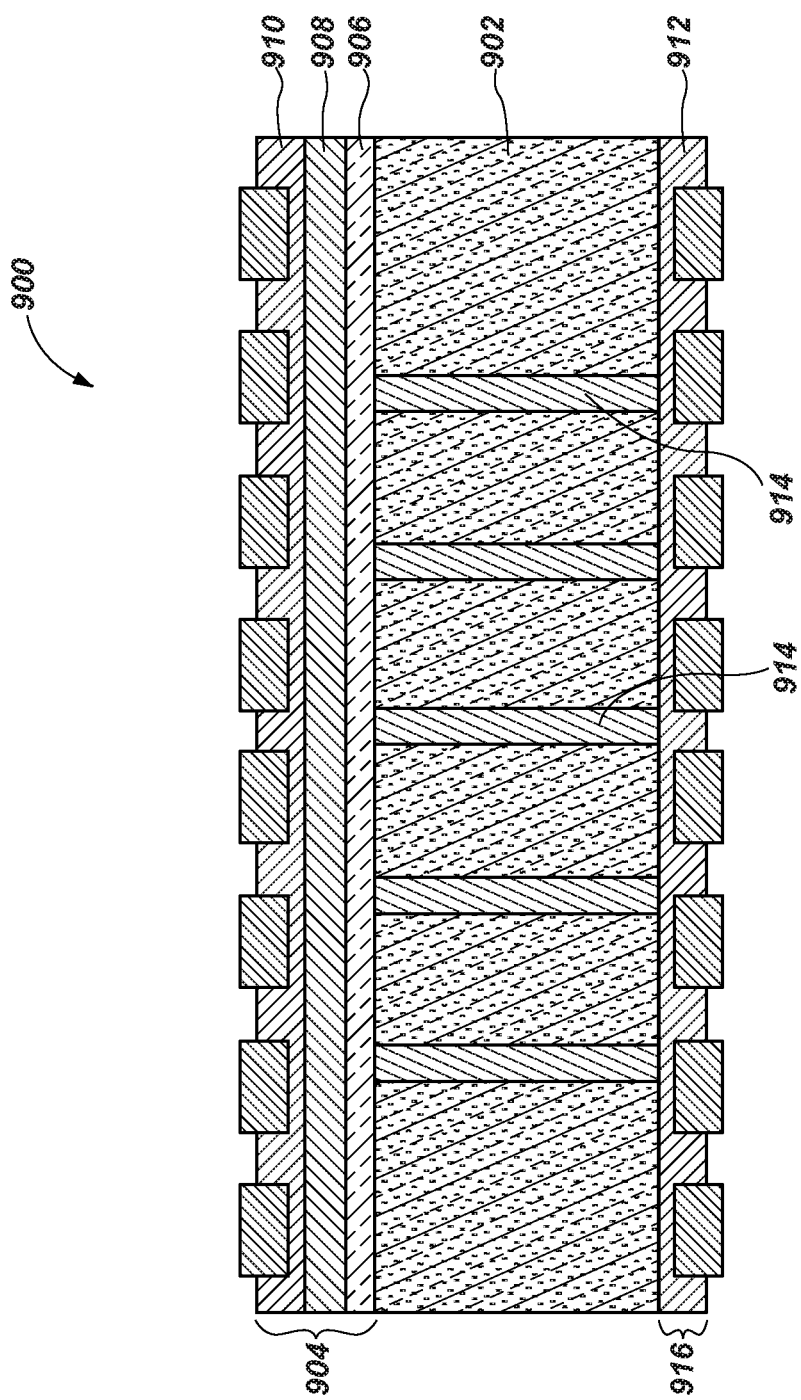
FIG. 9 is a simplified cross-sectional side view of a semiconductor device known to the inventor.
Figure 10:
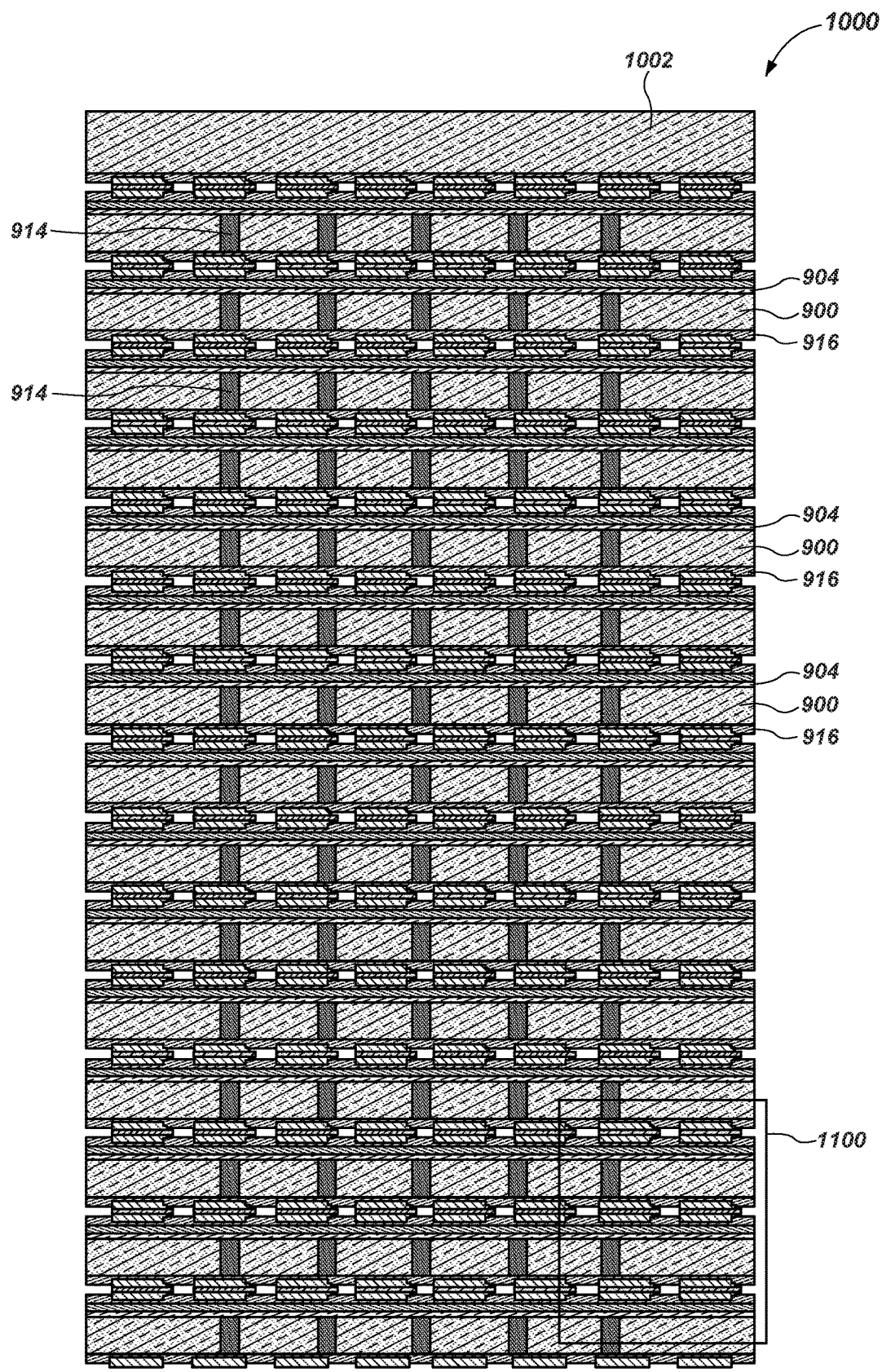
FIG. 10 is a simplified cross-sectional side view of an assembly of semiconductor devices known to the inventor.
Figure 11:
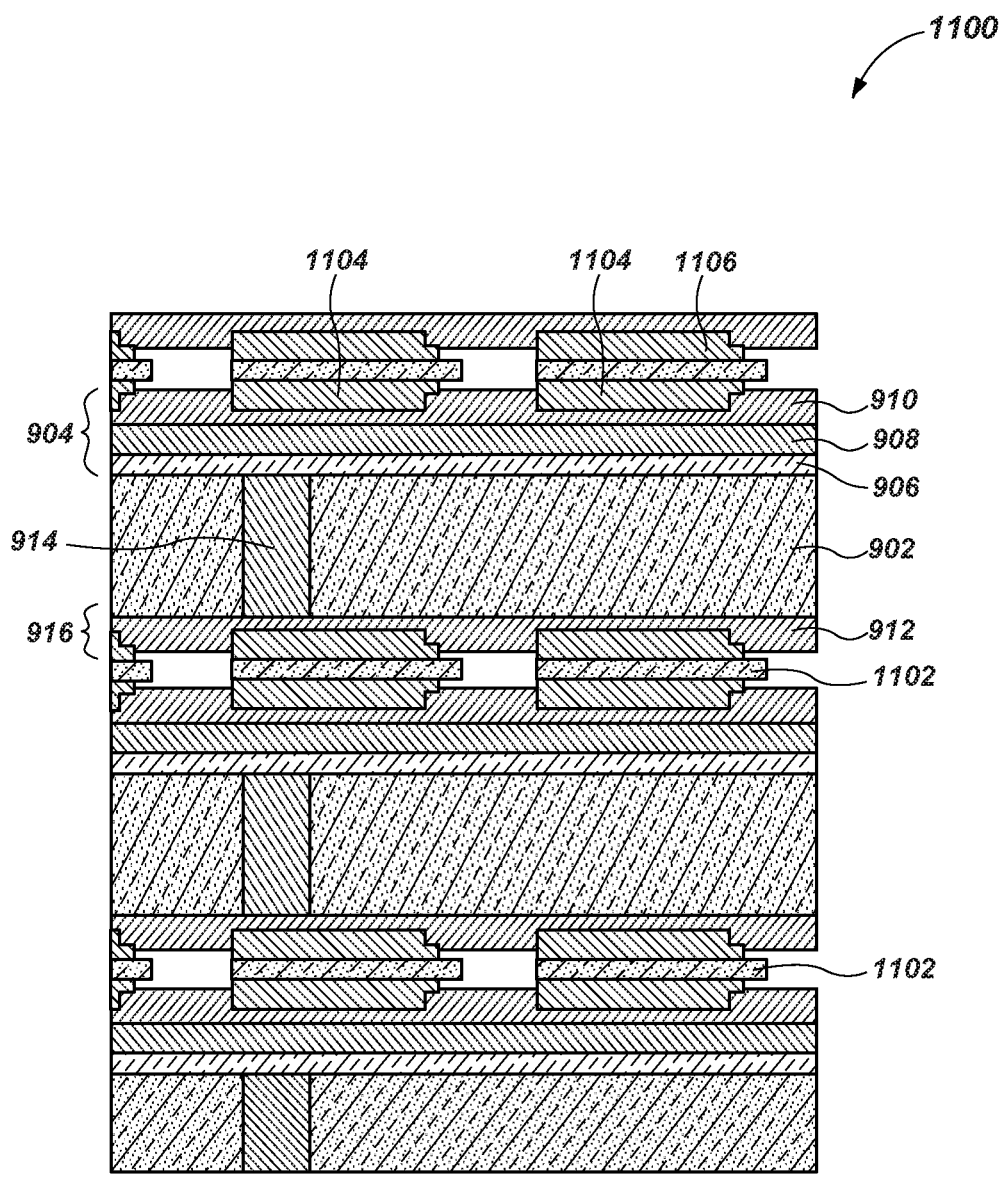
FIG. 11 is an enlarged simplified cross-sectional side view of a highlighted region of FIG. 10.

FIG. 7 is a simplified cross-sectional side view of an assembly 700 of semiconductor devices in accordance with this disclosure. FIG. 8 is a simplified cross-sectional side view of a framed rectangle region 800 of FIG. 7. With combined reference to FIG. 7 and FIG. 8, the assembly 700 may include, for example, multiple semiconductor devices 100 as shown in FIG. 1 and described throughout this disclosure in a stack. More specifically, each underlying respective semiconductor device 100 in the assembly 700 may be configured as generally described in connection with FIG. 1 and throughout this disclosure, and all overlying respective semiconductor devices 100 in the assembly 700 but a top-most respective semiconductor device 702 may be configured as generally described in connection with FIG. 1 and throughout this disclosure. In some embodiments, the top-most respective semiconductor device 702 may include, for example, a die 706 including a semiconductor material free of any vias 132 extending longitudinally therethrough, an active surface 708 facing, and electrically connected to, a first active surface 104 of an underlying respective semiconductor device 100 via bond pads 710 on the active surface 708 of the die 706.

Each overlying respective semiconductor device 100 or 702 may be connected to an underlying respective semiconductor device 100 by an electrical connection between the respective second active surface 106 or lone active surface 708 of the overlying respective semiconductor device 100 or 702 and the respective first active surface 104 of the underlying respective semiconductor device 100. For example, electrically conductive elements 712 may be interposed between, and electrically and mechanically connected to, the first bond pads 128 of the underlying respective semiconductor devices 100 and the second bond pads 130 or lone bond pad 710 of the overlying respective semiconductor device 100 or 702. The electrically conductive element 712 may include, for example, masses, balls, bumps, columns, pillars, or other structures of electrically conductive material (e.g., solder).

The respective first active surface 104 of each respective semiconductor device 100 or each respective semiconductor device 100 but for the top-most respective semiconductor device 702 in the stack may be electrically connected to the respective second active surface 106 by at least one via 132 extending through the respective die 102. For example, signals generated by the semiconductor devices 100 and 702 in the stack may be routed longitudinally through the stack utilizing the bond pads 710, electrically conductive elements 712, first bond pads 128, vias 132, and second bond pads 130.

A dielectric material 704 may be positioned in the bond lines between adjacent semiconductor devices 100 and 702. For example, the dielectric material 704 may be located in spaces longitudinally between adjacent first active surfaces 104 and second active surfaces 106 or the adjacent lone active surface 708 and first active surface 104 and laterally between the first bond pads 128, second bond pads 130, bond pads 710, and electrically conductive elements 712. The dielectric material 704 may include, for example, a curable polymer material (e.g., a non-conductive film (NCF), a wafer level underfill (WLUF), a capillary underfill (CUF)). The stack may also be encapsulated in an encapsulant such as an epoxy molding compound, and mounted to an interposer or other substrate to form a package for connection to higher-level packaging, as known in the art.

In other words, assemblies of semiconductor devices in accordance with this disclosure may include semiconductor devices supported on one another in a stack. At least one of the semiconductor devices may include a die including a semiconductor material having a first active surface including first integrated circuitry on a first side of the die and a second active surface including second integrated circuitry on a second, opposite side of the die.

In some embodiments, assemblies of semiconductor devices may include stacked semiconductor memory devices. At least one of the semiconductor devices may include a composite semiconductor die including two die portions joined back-to-back. A first active surface including first integrated memory circuitry may be located on a first die portion. A second active surface including second integrated memory circuitry may be located on a second die portion.

Figure 12:
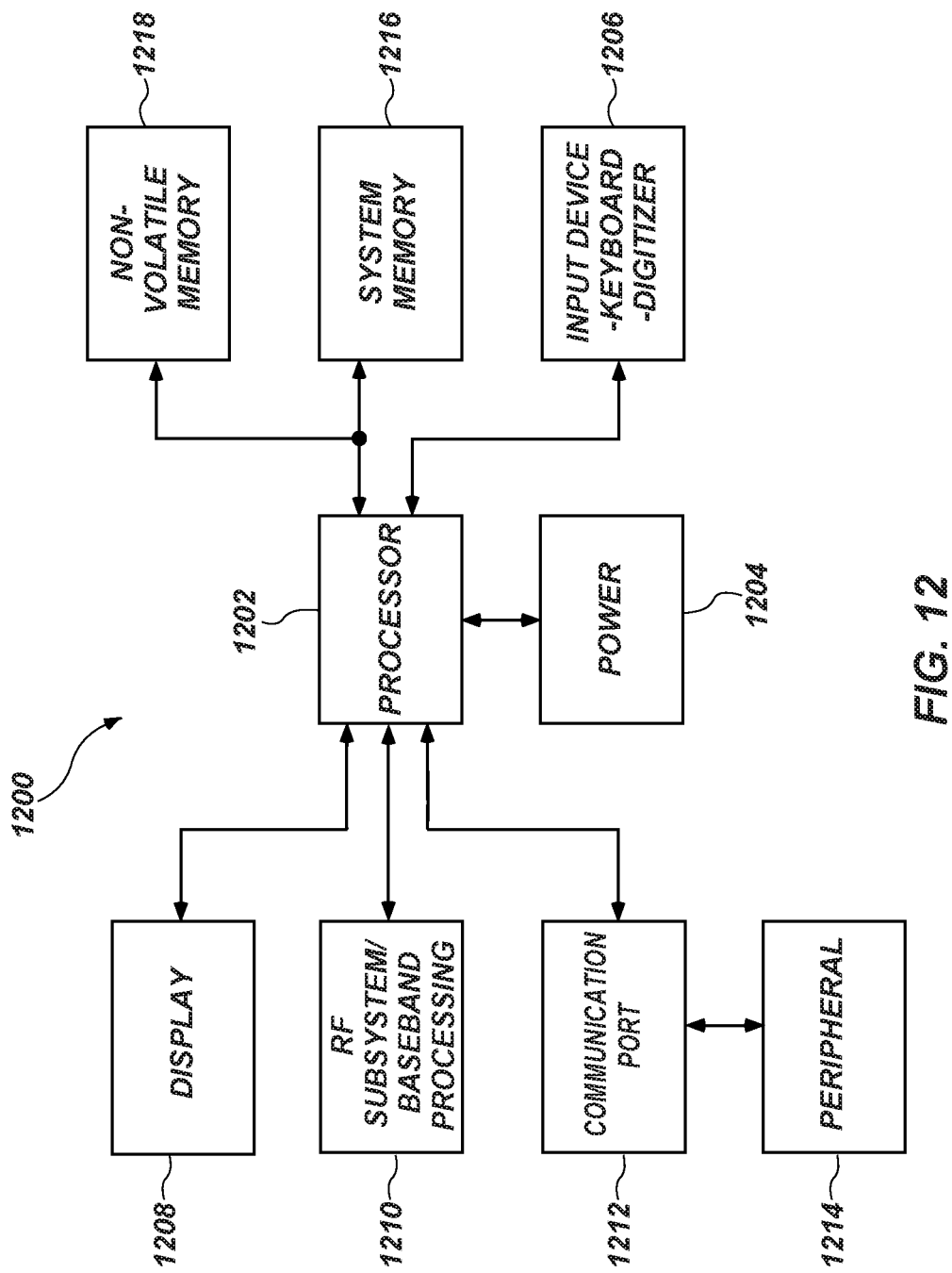
FIG. 12 is a schematic view of a processor-based system 1200 including one or more semiconductor devices in accordance with this disclosure.

With reference to FIG. 12, depicted is a processor-based system 1200. The processor-based system 1200 may include various semiconductor devices manufactured in accordance with embodiments of the present disclosure. The processor-based system 1200 may be any of a variety of types such as a computer, pager, cellular phone, personal organizer, control circuit, or other electronic device. The processor-based system 1200 may include one or more processors 1202, such as a microprocessor, to control the processing of system functions and requests in the processor-based system 1200. The processor 1202 and other subcomponents of the processor-based system 1200 may include microelectronic devices (e.g., microelectronic devices including one or more of the microelectronic device structures 100, 200, 300, 500) manufactured in accordance with embodiments of the present disclosure.

The processor-based system 1200 may include a power supply 1204 in operable communication with the processor 1202. For example, if the processor-based system 1200 is a portable system, the power supply 1204 may include one or more of a fuel cell, a power scavenging device, permanent batteries, replaceable batteries, and rechargeable batteries. The power supply 1204 may also include an AC adapter; therefore, the processor-based system 1200 may be plugged into a wall outlet, for example. The power supply 1204 may also include a DC adapter such that the processor-based system 1200 may be plugged into a vehicle cigarette lighter or a vehicle power port, for example.

Various other devices may be coupled to the processor 1202 depending on the functions that the processor-based system 1200 performs. For example, a user interface 1206 may be coupled to the processor 1202. The user interface 1206 may include input devices such as buttons, switches, a keyboard, a light pen, a mouse, a digitizer and stylus, a touch screen, a voice recognition system, a microphone, or a combination thereof. A display 1208 may also be coupled to the processor 1202. The display 1208 may include an LCD display, an SED display, a CRT display, a DLP display, a plasma display, an OLED display, an LED display, a three-dimensional projection, an audio display, or a combination thereof. Furthermore, an RF sub-system/baseband processor 1210 may also be coupled to the processor 1202. The RF sub-system/baseband processor 1210 may include an antenna that is coupled to an RF receiver and to an RF transmitter (not shown). A communication port 1212, or more than one communication port 1212, may also be coupled to the processor 1202. The communication port 1212 may be adapted to be coupled to one or more peripheral devices 1214, such as a modem, a printer, a computer, a scanner, or a camera, or to a network, such as a local area network, remote area network, intranet, or the Internet, for example.

The processor 1202 may control the processor-based system 1200 by implementing software programs stored in the memory. The software programs may include an operating system, database software, drafting software, word processing software, media editing software, or media playing software, for example. The memory is operably coupled to the processor 1202 to store and facilitate execution of various programs. For example, the processor 1202 may be coupled to system memory 1216, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 1216 may include volatile memory, non-volatile memory, or a combination thereof. The system memory 1216 is typically large so that it can store dynamically loaded applications and data. In some embodiments, the system memory 1216 may include one or more semiconductor devices, such as the semiconductor devices described above, including stacks of such semiconductor devices.

The processor 1202 may also be coupled to non-volatile memory 1218, which is not to suggest that system memory 1216 is necessarily volatile. The non-volatile memory 1218 may include one or more of STT-MRAM, MRAM, read-only memory (ROM) such as an EPROM, resistive read-only memory (RROM), and flash memory to be used in conjunction with the system memory 1216. The size of the non-volatile memory 1218 is typically selected to be just large enough to store any necessary operating system, application programs, and fixed data. Additionally, the non-volatile memory 1218 may include a high-capacity memory such as disk drive memory, such as a hybrid-drive including resistive memory or other types of non-volatile solid-state memory, for example. The non-volatile memory 1218 may include semiconductor devices, such as the semiconductor devices described above.

In other words, electronic systems in accordance with this disclosure may include an input device, an output device, at least one processor, and at least one memory device. The at least one memory device may include a semiconductor material having active surfaces including integrated circuitry on opposing sides thereof.

By providing active surfaces including integrated circuitry on both sides of a semiconductor device, rather than just one, the circuit density of the semiconductor device may be increased. For example, when the integrated circuitry and other features of the active surfaces are at least substantially identical, in the case of a memory device, the memory density of the semiconductor device may be doubled. As a result, the operative performance of the semiconductor device may also be doubled. In addition, providing active surfaces on two opposite sides of a semiconductor device may enable a single semiconductor device to take the place of what would conventionally require two semiconductor devices. Reducing the number of semiconductor devices required to achieve desired performance may reduce the height of an assembly of the semiconductor devices. In addition, reducing the number of semiconductor devices may also reduce the number of interconnections between the semiconductor devices, improving signal quality and speed. Reducing the number of interconnections between semiconductor devices may also reduce the number of instances of dielectric material in bond lines between the semiconductor devices, the presence of which generally inhibits heat flow through and out of the assembly. As a result, assemblies and semiconductor devices according to the disclosure may have the synergistic benefit of increasing power density and performance while improving thermal management, particularly in comparison to conventional approaches providing only one active surface on one side of a semiconductor device.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventor.

What is claimed is:

1. A semiconductor device, comprising:
   a die comprising a semiconductor material, the die comprising two die portions:
   a first active surface comprising first active circuitry on a first die portion; and
   a second active surface comprising second active circuitry on a second die portion;

the first die portion and the second die portion joined together with the first active surface facing away from the second active surface;

wherein a first FEOL structure adjacent to the first die portion includes the first active circuitry, a first BEOL structure is located on a side of the first FEOL structure opposite the first die portion, and a first interconnect adjacent to the first BEOL structure is located opposite the first FEOL structure; and wherein a second FEOL structure adjacent to the second die portion includes the second active circuitry, a second BEOL structure is located on a side of the second FEOL structure opposite the second die portion, and a second interconnect adjacent to the second BEOL structure is located opposite the second FEOL structure.

2. The semiconductor device of claim 1, further comprising at least one via comprising a first via portion extending from the first active surface through the first die portion and a second via portion extending from the second active surface through the second die portion aligned with and contacting the first via portion.

3. The semiconductor device of claim 1, further comprising vias each comprising first via portions extending from the first active surface through the first die portion and second via portions extending from the second active surface through the second die portion, the second via portions aligned with and contacting the first via portions.

4. The semiconductor device of claim 3, wherein each of the vias extends from between the first FEOL structure and the second FEOL structure, between the first BEOL structure and the second BEOL structure, or between the first interconnect and the second interconnect.

5. The semiconductor device of claim 1, wherein the first FEOL and BEOL structures are at least substantially identical in structure and function to the second FEOL and BEOL structures.

6. An assembly of semiconductor devices, comprising:
stacked semiconductor memory devices, at least each underlying respective semiconductor memory device located below an overlying respective semiconductor memory device in the stack comprising:
  a composite semiconductor die comprising two die portions joined back-to-back;
  a first active surface comprising first integrated memory circuitry on a first die portion; and
  a second active surface comprising second integrated memory circuitry on a second die portion;
  wherein a first FEOL structure adjacent to the first die portion includes the first active circuitry, a first BEOL structure is located on a side of the first FEOL structure opposite the first die portion, and a first interconnect adjacent to the first BEOL structure is located opposite the first FEOL structure; and
  wherein a second FEOL structure adjacent to the second die portion includes the second active circuitry, a second BEOL structure is located on a side of the second FEOL structure opposite the second die portion, and a second interconnect adjacent to the second BEOL structure is located opposite the second FEOL structure.

7. The assembly of claim 6, wherein:
each overlying respective semiconductor memory device or each overlying respective semiconductor memory device but for a top-most respective semiconductor memory device is connected to an underlying respective semiconductor memory device by an electrical connection between the respective second active surface of the overlying respective semiconductor memory device and the respective first active surface of the underlying respective memory semiconductor device;

each underlying respective semiconductor memory device is connected to an overlying respective semiconductor memory device by an electrical connection between the respective first active surface of the underlying respective semiconductor memory device and the respective second active surface of the overlying respective semiconductor memory device; and the respective first active surface of each respective semiconductor memory device but for the top-most respective semiconductor memory device in the stack is electrically connected to the respective second active surface by at least one via extending through the respective die, the at least one via comprising a via portion of the first die portion and a second via portion of the second die portion.

8. A method of making a semiconductor device, comprising:
forming first integrated circuitry on a first active surface on a first side of a die comprising a semiconductor material;
forming a first FEOL structure adjacent to the first side, the first FEOL structure comprising the first integrated circuitry;
forming a first BEOL structure on a side of the first FEOL structure opposite the die;
forming a first interconnect adjacent to the first BEOL structure and located opposite the first FEOL structure;
forming second integrated circuitry on a second active surface on a second, opposite side of the die;
forming a second FEOL structure adjacent to the second side, the second FEOL structure comprising the second integrated circuitry;
forming a second BEOL structure on a side of the second FEOL structure opposite the die; and
forming a second interconnect adjacent to the second BEOL structure and located opposite the second FEOL structure.

9. The method of claim 8, further comprising:
planarizing the second, opposite side of the die after forming the first integrated circuitry and before forming the second integrated circuitry;
supporting the first active surface on a carrier after forming the first active surface, before forming the second integrated circuitry, and while forming the second integrated circuitry; and
removing the carrier after forming the second integrated circuitry.

10. The method of claim 9, further comprising supporting the carrier on a cooling chuck while forming the second integrated circuitry.

11. The method of claim 8,
wherein forming the first integrated circuitry comprises forming the first integrated circuitry on a first, discrete portion of the die;
wherein forming the second integrated circuitry comprises forming the second integrated circuitry on a second, discrete portion of the die; and
further comprising bonding the first, discrete portion to the second, discrete portion.

12. The method of claim 11, wherein bonding the first, discrete portion and the second, discrete portion comprises contacting a surface of the first, discrete portion opposite the first active surface to a surface of the second, discrete portion opposite the second active surface and exposing the first, discrete portion and the second, discrete portion to an elevated temperature to bond the first, discrete portion and the second, discrete portion.

13. The method of claim 12, further comprising plasma-stimulating bonding between semiconductor material of the first, discrete portion and semiconductor material of the second, discrete portion.

14. The method of claim 12,
wherein each of the first, discrete portion and the second, discrete portion comprises at least one via portion comprising an electrically conductive material extending through the semiconductor material of the respective one of the first, discrete portion or the second, discrete portion;
further comprising aligning via portions of the first, discrete portion with corresponding via portions of the second, discrete portion; and
wherein exposing the first, discrete portion and the second, discrete portion to the elevated temperature comprises diffusion bonding the electrically conductive material of each via portion and the electrically conductive material of each corresponding via portion to one another.

15. The method of claim 8, wherein the die comprises a region of a wafer of the semiconductor material and further comprising:
forming respective first integrated circuitry on a respective first side of each respective die comprising a respective region of the wafer;
forming respective second integrated circuitry on a respective second, opposite side of each respective die; and
singulating the die and each respective die from a remainder of the wafer.

16. The method of claim 15, further comprising maintaining the first integrated circuitry at a reduced temperature while forming the second integrated circuitry.

17. The method of claim 8, further comprising singulating the die from a wafer of the semiconductor material before completion of the relative positioning of one or more of the first active surface, second active surface, and vias.

18. The method of claim 8, further comprising forming at least one via comprising electrically conductive material extending through the semiconductor material of the die before forming the first integrated circuitry while forming the first integrated circuitry while forming the second integrated circuitry, or after forming the first integrated circuitry and the integrated circuitry.

19. A method of forming a semiconductor device, comprising:
independently forming an FEOL structure, a BEOL structure, and an interconnect on active surfaces of each of two separate die portions comprising semiconductor material; and
bonding the two separate die portions by back sides thereof opposite the active surfaces.

20. The method of claim 19, wherein bonding the two separate die portions comprises plasma-enhanced bonding.

21. The method of claim 19, wherein each of the two separate die portions comprises conductive vias extending at least from the active surface thereof to a back side thereof, and wherein bonding the two separate die portions comprises diffusion bonding of aligned conductive vias.

22. An electronic system, comprising:
an input device;
an output device;
at least one processor; and
at least one memory device comprising a semiconductor material having active surfaces comprising integrated circuitry on opposing sides thereof;
wherein a first FEOL structure adjacent to a first active surface of the at least one memory device includes first integrated circuitry, a first BEOL structure is located on a side of the first FEOL structure, and a first interconnect adjacent to the first BEOL structure is located opposite the first FEOL structure; and
wherein a second FEOL structure adjacent to a second, opposite active surface of the at least one memory device includes second integrated circuitry, a second BEOL structure is located on a side of the second FEOL structure, and a second interconnect adjacent to the second BEOL structure is located opposite the second FEOL structure.

23. The electronic system of claim 22, wherein the at least one memory device comprises a stack of memory devices.

24. The electronic system of claim 22, wherein the semiconductor material comprises two die portions forming a composite die.

* * * * *

UNITED STATES PATENT AND TRADEMARK OFFICE
CERTIFICATE OF CORRECTION

PATENT NO. : 11,538,762 B2
APPLICATION NO. : 16/751676
DATED : December 27, 2022
INVENTOR(S) : Hyunsuk Chun It is certified that error appears in the above-identified patent and that said Letters Patent is hereby corrected as shown below:

In the Specification

Column 4, Line 52, change "("SOT")" to --("SOI")--
Column 12, Line 54, change "500 µm" to --50 µm--

In the Claims

Claim 18, Column 22, Line 4, change "the integrated" to --the second integrated--

Signed and Sealed this
Sixteenth Day of May, 2023

Katherine Kelly Vidal
*Director of the United States Patent and Trademark Office*